United States Patent
Chou et al.

(10) Patent No.: US 8,626,343 B2
(45) Date of Patent: Jan. 7, 2014

(54) MONITOR AND CONTROL SYSTEM AND METHOD FOR SERVER MODEL

(75) Inventors: Shu-Hsien Chou, Tu-Cheng (TW); Li-Wen Guo, Shenzhen (CN); Kang-Bin Wang, Shenzhen (CN); Bi-Hui Tan, Shenzhen (CN)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 327 days.

(21) Appl. No.: 13/015,023

(22) Filed: Jan. 27, 2011

(65) Prior Publication Data

US 2012/0035783 A1 Feb. 9, 2012

(30) Foreign Application Priority Data

Aug. 3, 2010 (CN) .......................... 2010 1 0243713

(51) Int. Cl.
*G06F 19/00* (2011.01)

(52) U.S. Cl.
USPC ........................................ 700/275; 702/113

(58) Field of Classification Search
USPC ................. 700/275, 276, 299, 300; 702/113; 709/224; 307/139; 318/473; 361/379.48, 688.103
See application file for complete search history.

(56) References Cited

U.S. PATENT DOCUMENTS

| | | | | |
|---|---|---|---|---|
| 4,669,025 A * | 5/1987 | Barker et al. | ................. | 361/103 |
| 5,727,928 A * | 3/1998 | Brown | ........................ | 417/44.11 |
| 6,351,601 B1 * | 2/2002 | Judkins, III | ................... | 388/815 |
| 6,526,333 B1 * | 2/2003 | Henderson et al. | ........... | 700/300 |
| 6,662,136 B2 * | 12/2003 | Lamb et al. | .................... | 702/132 |
| 6,835,894 B2 * | 12/2004 | Lee | ............... | 174/250 |
| 6,934,786 B2 * | 8/2005 | Irving et al. | .................. | 710/300 |
| 7,483,270 B2 * | 1/2009 | Blake | ....................... | 361/679.48 |
| 7,684,192 B2 * | 3/2010 | Holmes et al. | ................ | 361/695 |
| 7,984,192 B2 * | 7/2011 | Burr et al. | ...................... | 709/250 |
| 7,995,336 B2 * | 8/2011 | Tang et al. | ............... | 361/679.33 |
| 2003/0120394 A1 * | 6/2003 | Ziarnik | ......................... | 700/300 |
| 2004/0113228 A1 * | 6/2004 | Yamada et al. | ............... | 257/507 |
| 2004/0244397 A1 * | 12/2004 | Kim | ............................ | 62/259.2 |
| 2006/0259797 A1 * | 11/2006 | Fung | ........................... | 713/300 |
| 2008/0306634 A1 * | 12/2008 | Rozzi et al. | .................... | 700/300 |
| 2009/0262495 A1 * | 10/2009 | Neudorfer | ............... | 361/679.47 |

* cited by examiner

*Primary Examiner* — Kidest Bahta
(74) *Attorney, Agent, or Firm* — Altis Law Group, Inc.

(57) ABSTRACT

A monitor and control system includes a server model, a number of switches, a temperature sensor mounted in the server model, a monitor and control device, and a microcontroller. The switches are connected to the resistors to control current through the resistors. The temperature sensor is mounted in the server model. The monitor and control device is connected to the server model and configured to monitor and control the server model. The microcontroller is configured to switch the switches on and off and send temperature information sensed by the temperature sensor to the monitor and control device.

7 Claims, 3 Drawing Sheets

MONITOR AND CONTROL SYSTEM AND METHOD FOR SERVER MODEL

BACKGROUND

1. Technical Field

The present disclosure relates to a monitor and control system and method for monitoring and controlling modeling of a server design.

2. Description of Related Art

To configure component layout in a server design with optimized heat dissipating ability, a model or prototype of a server design is made and tested under various operating conditions. The model can include a number of heat generating components (e.g., resistors), fans, and a temperature sensor installed in a chassis thereof. Each of the heat generating components is connected to a switch and can be selectively turned on or off during testing. The more heat generating components that are enabled, the more heat the server model generates. A fan rotating speed of each of the fans is adjusted by an operator to control temperatures in the server model. However, the typical method for monitoring and controlling the server model requires many manual operations be performed by the operator, which is inefficient.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
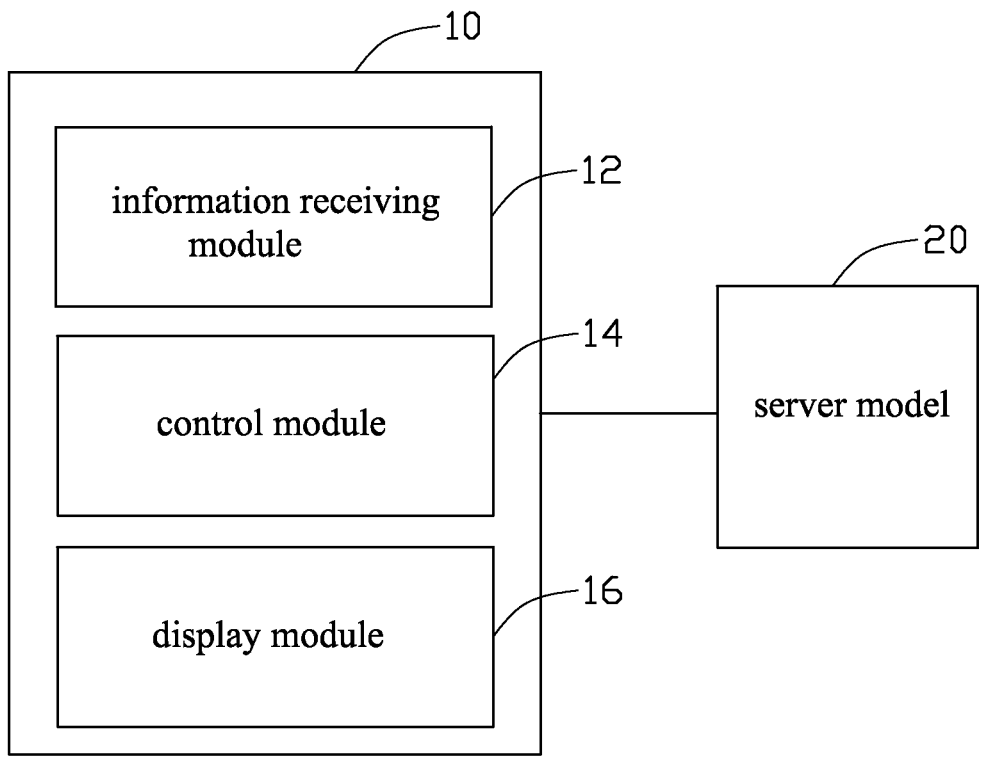
FIG. 1 is a block diagram of a monitor and control system for a server model in accordance with an embodiment.

Referring to FIG. 1, an embodiment of a monitor and control system includes a monitor, control device 10, and a server model 20 connected to the monitor and control device 10. The server model 20 can be configured to model various layouts of components and simulate various working conditions. The monitor and control device 10 is configured to monitor and control the server models 20, thereby helping designers to find optimal configurations with efficient heat dissipation.

The monitor and control device 10 includes an information receiving module 12, a control module 14 and a display module 16. The information receiving module 12 is configured to receive information from the server model 20. The control module 14 is configured to control the server model 20. The display module 16 is configured to display information received from the server model 20.

Figure 2:
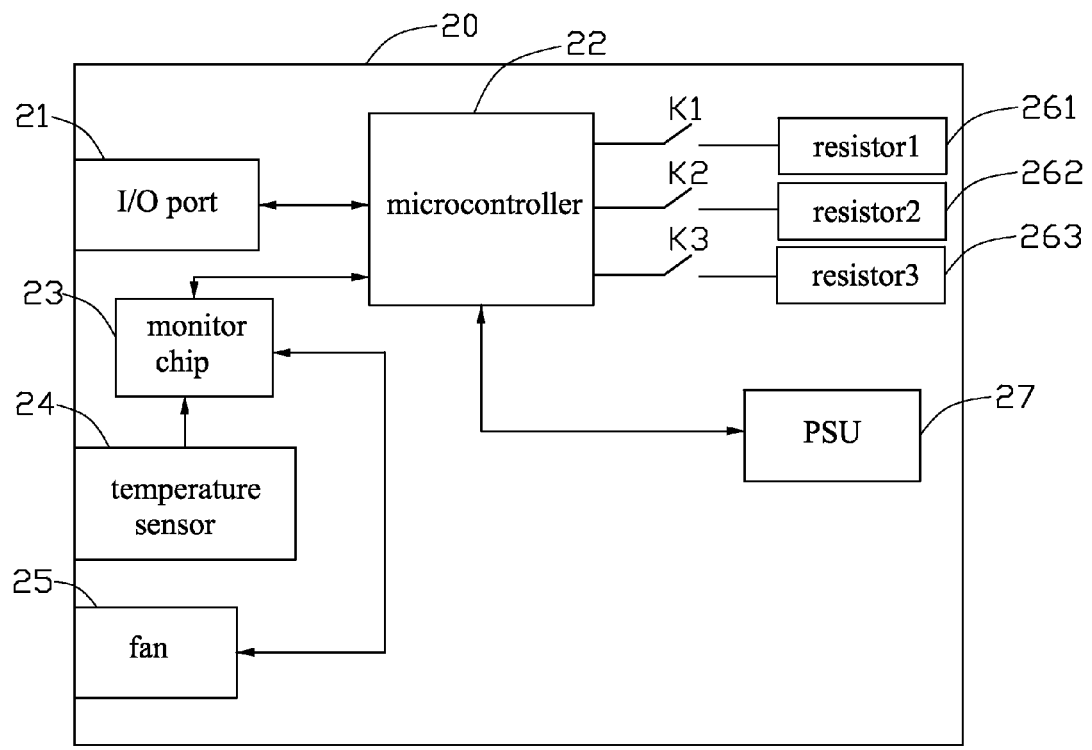
FIG. 2 is a detailed block diagram of the server model of FIG. 1.

Referring to FIG. 2, the server simulating module 20 includes an I/O port 21, a microcontroller 22, a monitor chip 23, a temperature sensor 24, a fan 25, a power supply unit (PSU) 27, and resistors 261~263. The resistors 261~263 are connected to the microcontroller 22 via switches K1~K3. The microcontroller 22 can switch the switches K1~K3 on and off to send or cut off current to the resistors 261~263. The I/O port 21 is communicatively connected to the monitor and control device 10. The microcontroller 22 is connected to the PSU 27 to switch the PSU 27 on and off and monitor whether the PSU 27 can work normally. The monitor chip 23 is connected to the temperature sensor 24 and the fan 25, and communicatively connected to the microcontroller 22. The temperature sensor 24 senses a temperature in the server model 20 and sends the temperature to the monitor chip 23. The monitor chip 23 can monitor a rotating speed of the fan 25 and send the temperature and the fan speed to the microcontroller 22. Then the microcontroller 22 sends the temperature and the speed to the monitor and control device 10 via the I/O port 21.

To monitor and control the server model 20, the microcontroller 22 switches on the PSU 27 and switches on one or more of the switches K1~K3. Then one or more of the resistors 261~263 receives current and generates heat. In one embodiment, the server model 20 can have more resistors to simulate an even greater number of heat generating components of a server. The microcontroller 22 can enable one or more of the resistors to decrease or increase heat generated in the server model 20. The temperature sensor 24 senses a temperature in the server model 20 and sends the temperature to the monitor chip 23. The monitor chip 23 monitors rotating speed of the fan 25 and sends the temperature and the speed to the microcontroller 22. The microcontroller 22 sends the temperature and the speed to the information receiving module 12 of the monitor and control device 10 via the I/O port 21. The control module 14 of the monitor and control device 10 sends instructions to adjust the speed of the fan 25 as needed to attempt to control the temperature in the server model 20 to be within an desired range. The display module 16 of the monitor and control device 10 displays information received from the server model 20 so that designers can easily know whether a current design configuration is suitable.

Figure 3:
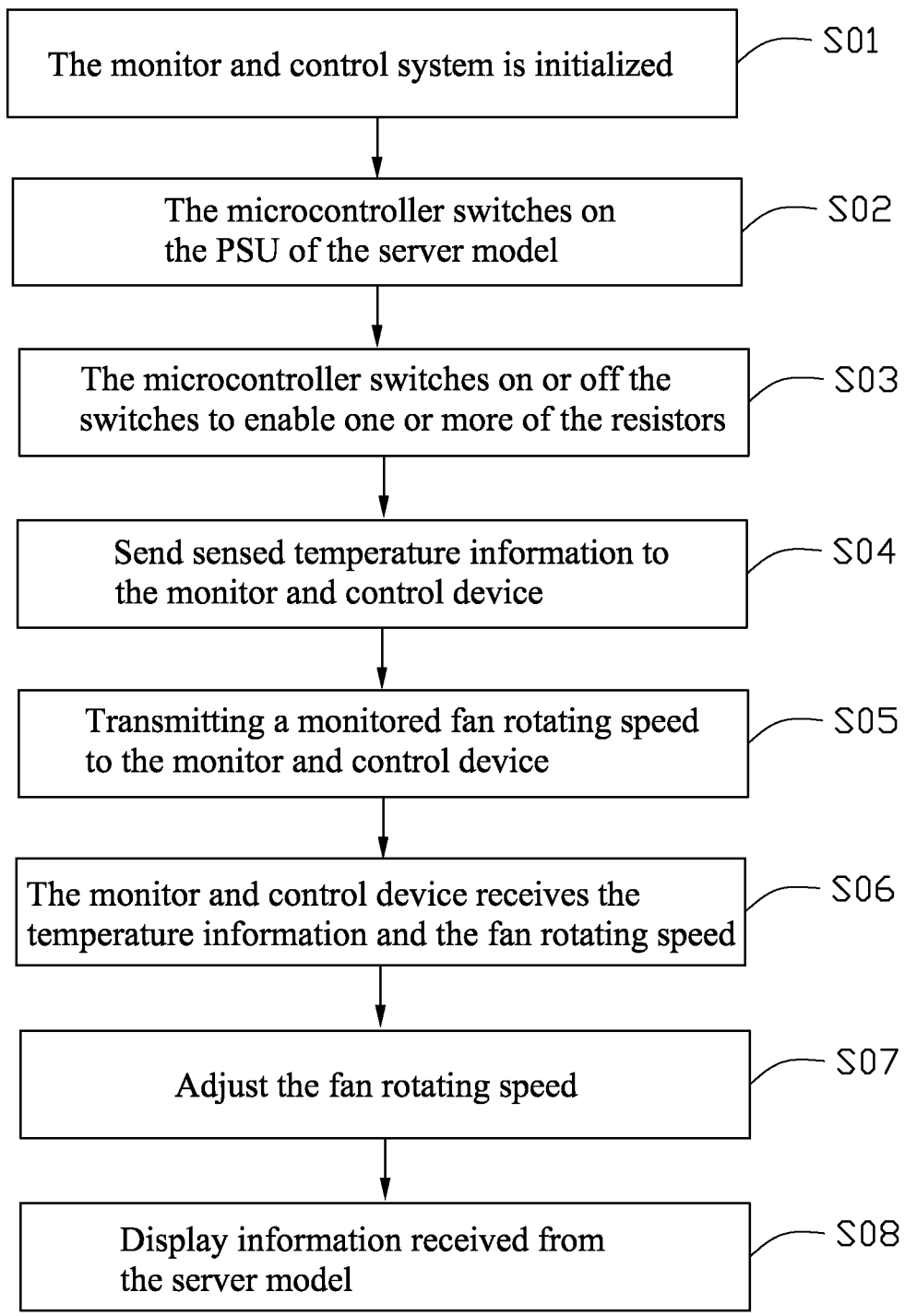
FIG. 3 illustrates a flowchart of a monitor and control method for a server model in accordance with an embodiment.

Referring to FIG. 3, one embodiment of a monitor and control method based upon the above described monitor and control system includes the following blocks.

In block S01, the monitor and control system is initialized.

In block S02, the microcontroller 22 sends an instruction to turn on the PSU 27.

In block S03, the microcontroller 22 switches on one or more of the switches K1~K3 to enable one or more of the resistors 261~263 to generate heat.

In block S04, the temperature sensor 24 senses a temperature in the server model 20; the temperature is first sent to the monitor chip 23, then sent to the monitor and control device 10 via the microcontroller 22.

In block S05, the monitor chip 23 monitors rotating speed of the fan 25 and sends the speed to the monitor and control device 10 via the microcontroller 22.

In block S06, the information receiving module 12 of the monitor and control device 10 receives information including the temperature and the fan speed from the I/O port 21 of the server model 20.

In block S07, the control module 14 of the monitor and control device 10 sends instructions to adjust the fan rotating speed of the fan 25 to attempt to control the temperature in the server model 20 to be within a desired range.

In block S08, the display module 16 of the monitor and control device 10 displays information received from the server model 20.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

What is claimed is:

1. A system comprising:
    a server model for configuring component layout in a server design with optimized heat dissipating ability, the server model comprising a plurality of resistors, the plurality of resistors selectively turned on or off to generate various quantity of heat in the server model to configure various operating conditions for the server model;
    a plurality of switches, connected to the plurality of resistors, configured to enable and disable the plurality of resistors;
    a temperature sensor mounted in the server model;
    a monitor and control device, connected to the server model, configured to monitor and control the server model; and
    a microcontroller, connected to the plurality of switches, configured to switch on and off the plurality of switches and send temperature information from the temperature sensor to the monitor and control device.

2. The system of claim 1, further comprising a monitor chip connected to the microcontroller, the monitor chip is also connected to the temperature sensor and configured to send the temperature information to the microcontroller.

3. The system of claim 2, wherein the server model further comprises a fan connected to the monitor chip, and the monitor chip is configured to monitor a fan rotating speed of the fan and send the fan rotating speed to the microcontroller.

4. The system of claim 3, wherein the monitor and control device comprises an information receiving module connected to the microcontroller, and the microcontroller is configured to send the temperature and the fan rotating speed to the information receiving module.

5. The system of claim 4, wherein the monitor and control device further comprises a control module to control the fan rotating speed.

6. The system of claim 5, wherein the monitor and control device further comprises a display module configured to display information monitored from the server model.

7. The system of claim 1, wherein the server model comprises a power supply unit connected to the microcontroller, and the microcontroller is configured to switch on and off the power supply unit and monitor the power supply unit.

* * * * *